(12) United States Patent
Ashmore et al.

(10) Patent No.: US 9,205,640 B2
(45) Date of Patent: Dec. 8, 2015

(54) PRINTING METHOD AND SCREEN PRINTING HEAD HAVING VIBRATION UNIT FOR VIBRATION OF THE SQUEEGEE BLADE

(75) Inventors: Clive Ashmore, Weymouth (GB); Mark Whitmore, Broadstone (GB); Gerry Cox, Wareham (GB)

(73) Assignee: ASM Assembly Systems Switzerland GmbH, Zurich (CH)

( * ) Notice: Subject to any disclaimer, the term of this patent is extended or adjusted under 35 U.S.C. 154(b) by 216 days.

(21) Appl. No.: 13/508,765

(22) PCT Filed: Nov. 9, 2010

(86) PCT No.: PCT/GB2010/002059
§ 371 (c)(1),
(2), (4) Date: Jan. 7, 2013

(87) PCT Pub. No.: WO2011/110795
PCT Pub. Date: Sep. 15, 2011

(65) Prior Publication Data
US 2013/0098254 A1    Apr. 25, 2013

(30) Foreign Application Priority Data

Nov. 9, 2009    (GB) .................................. 0919580.1

(51) Int. Cl.
| | |
|---|---|
| *B41F 15/44* | (2006.01) |
| *B41F 15/42* | (2006.01) |
| *B41F 15/12* | (2006.01) |
| *H05K 3/12* | (2006.01) |

(52) U.S. Cl.
CPC ................. *B41F 15/42* (2013.01); *B41F 15/12* (2013.01); *B41F 15/44* (2013.01); *H05K 3/1233* (2013.01)

(58) Field of Classification Search
CPC .......... B41F 15/12; B41F 15/42; B41F 15/44; B41F 15/46; H05K 3/1233; H05K 3/1225; H05K 3/12; H05K 3/34; H05K 2203/0292; H05K 2203/0139; H05K 2203/0126; B41P 2215/13; B41P 2215/132; B41M 1/12
USPC .......................................... 101/114, 123, 129
See application file for complete search history.

(56) References Cited

U.S. PATENT DOCUMENTS

| | | | |
|---|---|---|---|
| 3,902,414 | A | 9/1975 | Zimmer et al. |
| 3,964,386 | A | 6/1976 | Dini |
| 5,254,362 | A | 10/1993 | Shaffer et al. |
| 5,522,929 | A | 6/1996 | Erdmann |
| 2006/0255092 | A1 * | 11/2006 | Chen ............................... 228/39 |
| 2008/0145972 | A1 | 6/2008 | Ishikawa et al. |

FOREIGN PATENT DOCUMENTS

| | | |
|---|---|---|
| CN | 101207052 | 6/2008 |
| DE | 19854036 | 5/2000 |

(Continued)

*Primary Examiner* — Leslie J Evanisko
(74) *Attorney, Agent, or Firm* — Renner, Otto, Boisselle & Sklar, LLP (57) ABSTRACT

A screen printing head for and method of printing deposits of a print medium onto a workpiece through apertures in a printing screen, the printing head comprising a vibration unit for vibrating a printing blade to condition print medium forward of the printing blade, wherein the printing blade is vibrated at least one frequency in the range of from about 20 kHz to about 200 kHz and with a displacement of at least about 0.4 pm.

40 Claims, 12 Drawing Sheets

(56) References Cited

FOREIGN PATENT DOCUMENTS

| JP | 63199643 A | * | 8/1988 |
| JP | 8230305 | | 9/1996 |
| JP | 10138456 | | 5/1998 |
| JP | 2002001913 | | 1/2002 |
| JP | 2005238723 | | 9/2005 |
| JP | 2005288789 A | * | 10/2005 |
| JP | 2008284806 | | 11/2008 |
| KR | 10 2008 0055715 | | 6/2008 |

* cited by examiner

PRINTING METHOD AND SCREEN PRINTING HEAD HAVING VIBRATION UNIT FOR VIBRATION OF THE SQUEEGEE BLADE

This application is a national phase of International Application No. PCT/GB2010/002059 filed Nov. 9, 2010 and published in the English language.

The present invention relates to a screen printing head for and a method of printing a print medium through a printing screen, often alternatively referred to as a stencil, for printing deposits of a print medium onto a workpiece. Typically, the print medium can be a solder paste, such as in the fabrication of electronics components, or a silver paste, such as in the fabrication of conductor lines, for example, in solar cells.

BACKGROUND

With the continued miniaturisation of electronics components and structures, many of which utilize a screen printing process, there is a need to be able to print finer pitch deposits which have smaller area ratios, and with an acceptable transfer efficiency and area coverage.

The area ratio is the ratio of the open area of a printing aperture to the area of the walls of the printing aperture, whereby, as the area ratio decreases, there will be an increasing stiction of the print medium to the walls of the printing aperture and a decreasing stiction of the print medium to the substrate on which the print medium is printed. The area ratio currently dictates the stencil design, in that there is a lower limit to the area ratio, currently about 0.6, which can be used to achieve an acceptable transfer efficiency, typically about 75%.

Achieving an acceptable transfer efficiency is particularly problematic where deposits of a range of sizes are required, from standard size structures to ultra-fine pitch structures, in that standard size structures require the use of a relatively thick printing screen, typically 100 µm in thickness, in order to provide the necessary volume of print medium, but the consequence of using a relatively thick printing screen is that the printing apertures for the finer pitch structures necessarily have a low area ratio, which reduces the transfer efficiency for the deposits printed by those printing apertures. The transfer efficiency of the finer pitch apertures can be improved by reducing the thickness of the printing screen, but this has the consequence of reducing the volume of print medium which can be deposited from the standard size apertures.

SUMMARY OF THE INVENTION

It thus an aim of the present invention to provide an improved screen printing head and method which allows for the printing of deposits with increased transfer efficiency at lower area ratios.

Screen printing techniques have been developed which utilize vibration of the screen printing head, such as disclosed in U.S. Pat. No. 5,522,929, and these techniques apparently provide for an improved transfer efficiency.

The present inventors have, however, a screen printing head and method which provides for a significantly improved transfer efficiency as compared to existing screen printing techniques.

In one aspect the present invention provides a screen printing head for printing deposits of a print medium onto a workpiece through apertures in a printing screen, comprising: a main, support body for attachment to a screen printing machine; a support element to which a printing blade is in use attached; and a vibration unit which couples the support element to the support body to provide for vibration of the support element, and hence the printing blade when attached thereto.

In another aspect the present invention provides a method of printing deposits of a print medium onto a workpiece through apertures in a printing screen, the method comprising the steps of: attaching a main, support body to a screen printing machine; providing a support element to which a printing blade is attached; coupling the support element to the support body by a vibration unit; and operating the vibration unit to provide for vibration of the support element, and hence the printing blade attached thereto, to condition the print medium forward of the printing blade.

In a further aspect the present invention provides a method of printing deposits of a print medium onto a workpiece through apertures in a printing screen, the method comprising the step of vibrating a printing blade to condition print medium forward of the printing blade, wherein the printing blade is vibrated at at least one frequency in the range of from about 20 kHz to about 200 kHz and with a displacement of at least about 0.4 µm.

In still another aspect the present invention provides a printing blade comprising a blade element which includes a plurality of disruptions at spaced locations therealong, which act to isolate applied vibrational energy into respective segments of the blade element.

BRIEF DESCRIPTION OF THE DRAWINGS

Preferred embodiments of the present invention will now be described hereinbelow by way of example only with reference to the accompanying drawings, in which.

DETAILED DESCRIPTION

FIGS. 1 to 4 illustrate a screen printing head in accordance with a first embodiment of the present invention.

The screen printing head comprises a main support body 3, in this embodiment an elongate block, here formed of stainless steel, which is in use coupled to the print head transport mechanism (not illustrated) of a screen printing machine which is operative to displace the printing head over a printing screen which is located over a workpiece and print deposits of a print medium through a pattern of apertures in the printing screen onto the workpiece W, a support element 5, in this embodiment an elongate element, to which a printing blade 7 is attached, and a vibration unit 9 which couples the support element 5 to the main body 3 to provide for vibration of the support element 5, and hence the printing blade 7.

As will be discussed in more detail hereinbelow, the vibration of the printing blade 7 imparts an energy to the print medium ahead of the printing blade 7, which acts to condition the print medium. This conditioning improves the filling of the apertures in the printing screen and the transfer of the print medium from the filled apertures to the workpiece when separating the workpiece from the printing screen.

Figure 1:
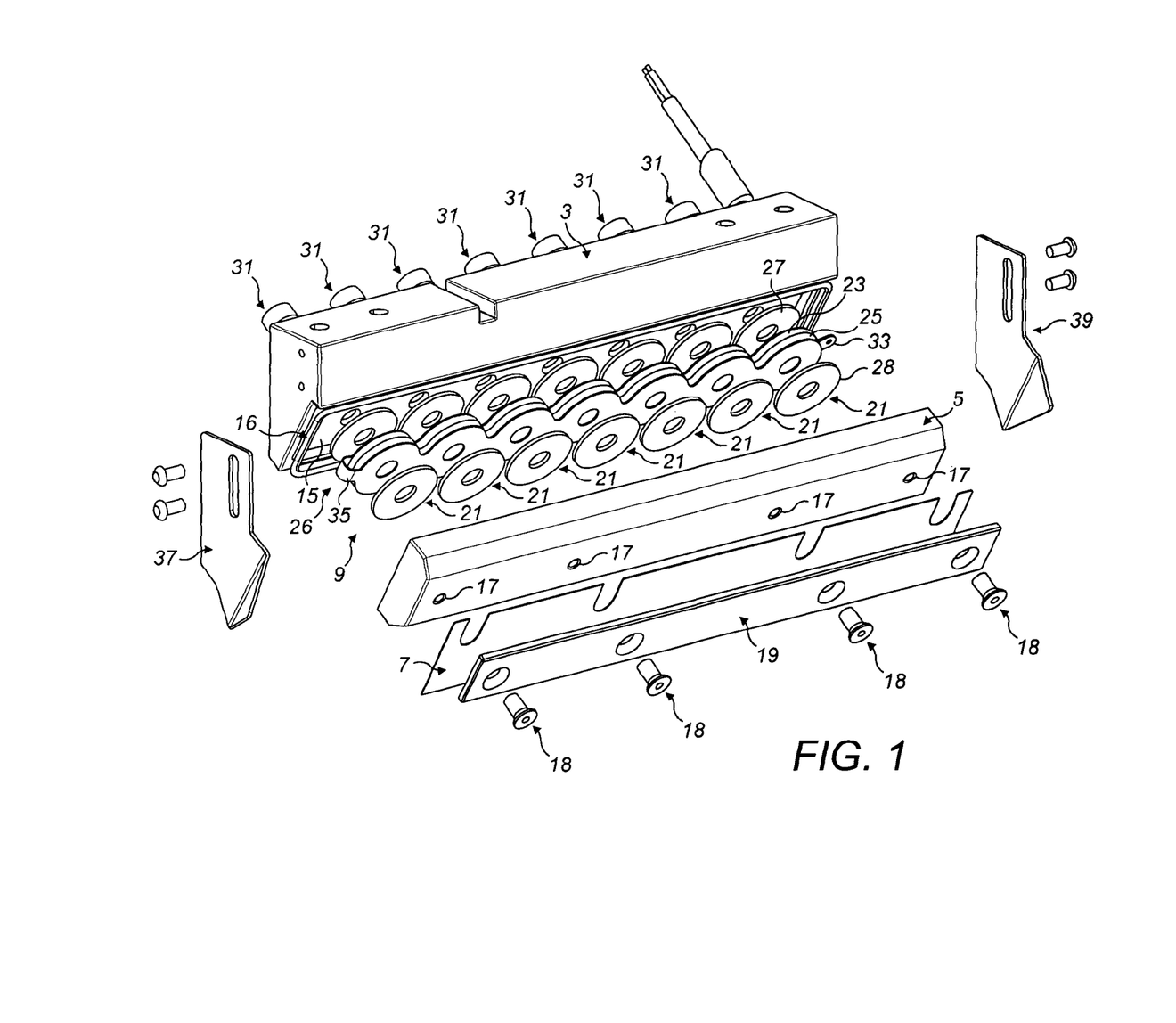
FIG. 1 illustrates an exploded perspective view of a screen printing head in accordance with a first embodiment of the present invention.
Figure 2:
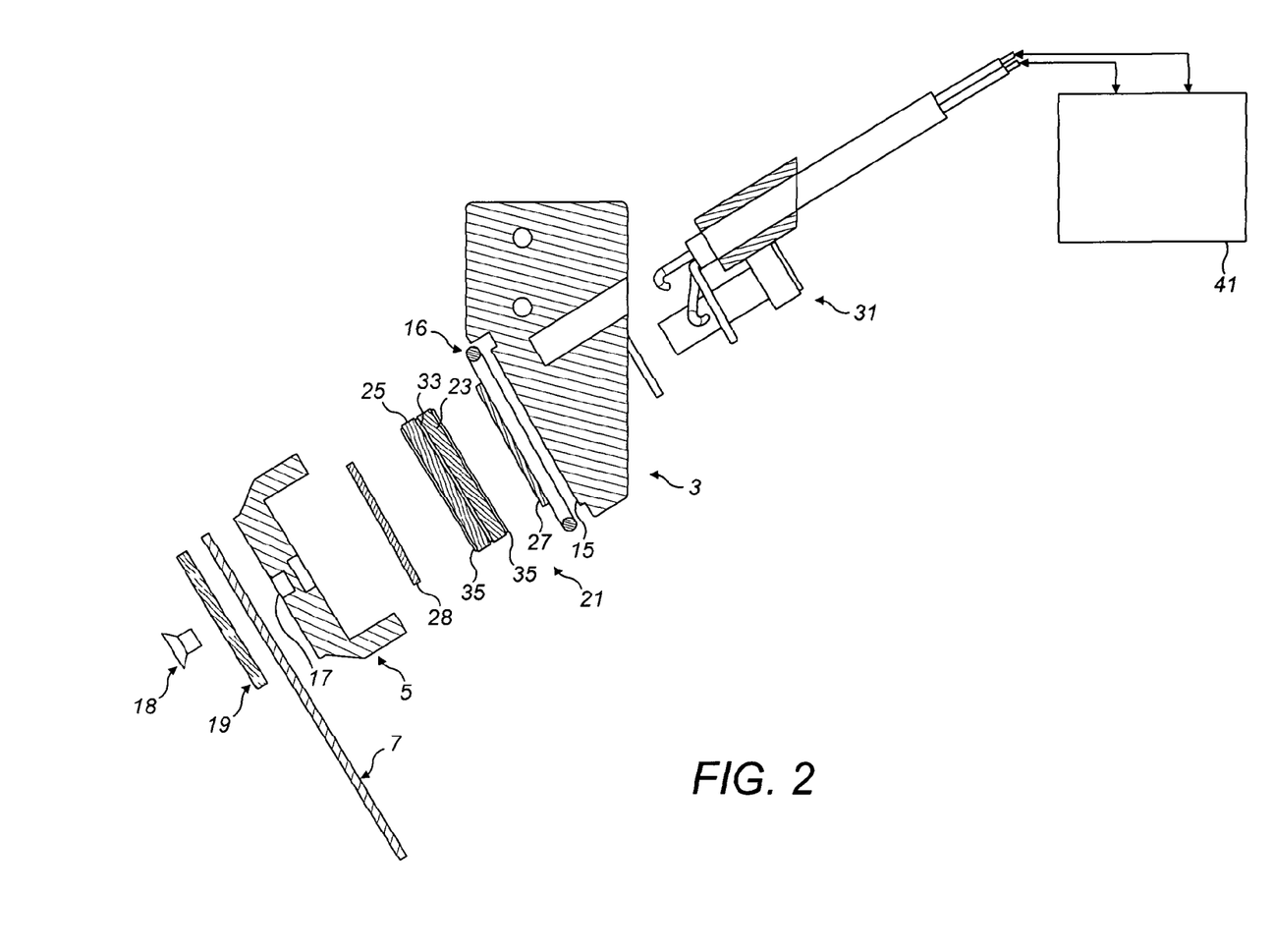
FIG. 2 illustrates an exploded vertical sectional view through the screen printing head of FIG. 1.

The main body 3 includes a forwardly-facing mounting surface 15 to which the vibration unit 9 is mounted, in this embodiment inclined to the vertical at an angle corresponding to the angle at which the printing blade 7 depends.

In this embodiment the main body 3 includes an O-ring seal 16 about the periphery of the mounting surface 15 thereof, against which the support element 5 is sealed, such as to enclose the vibration unit 9.

The support element 5 includes at least one, in this embodiment a plurality of attachment elements 17, in this embodiment a plurality of threaded couplings, here blind threaded apertures, arranged along the length of the support element 5, for enabling the printing blade 7 to be removably fitted to the support element without requiring dis-assembly of the vibration unit 9.

In this embodiment the printing blade 7 is a squeegee blade, here a metal blade, either formed of stainless steel or aluminium. Other possible blade materials include rubber, plastic and composite materials. In addition, the printing blade 7 could be a hybrid structure, such as a plastic blade with a metal screen-contacting tip element or a metal blade with a plastic screen-contacting tip element.

The printing blade 7 is attached to the support element 5 by at least one, in this embodiment a plurality of attachment elements 18, in this embodiment a plurality of threaded couplings, here a plurality of threaded screws, which are coupled to respective ones of the attachment elements 17 of the support element 5, and a retaining plate 19 which is clamped against the printing blade 7.

In this embodiment the vibration unit 9 is an ultrasonic unit for ultrasonically vibrating the support element 5, here in a frequency range of from about 20 kHz to about 200 kHz, in one embodiment at a frequency of at least about 30 kHz, in one embodiment at a frequency of at most about 100 kHz, preferably at most about 80 kHz, more preferably at most about 60 kHz and still more preferably at most about 50 kHz, and here with a displacement of at least about 0.4 µm, in one embodiment with a displacement of at least about 1 µm, preferably at least about 2 µm, more preferably at least about 5 µm, and in one embodiment with a displacement of at most about 100 µm, preferably a displacement of at most about 25 µm.

In this embodiment the vibration unit 9 comprises at least one vibrator 21, here a plurality of vibrators 21 which are spaced along the length of the main body 3.

In this embodiment the or each vibrator 21 comprises a piezoelectric actuator.

Figure 3:
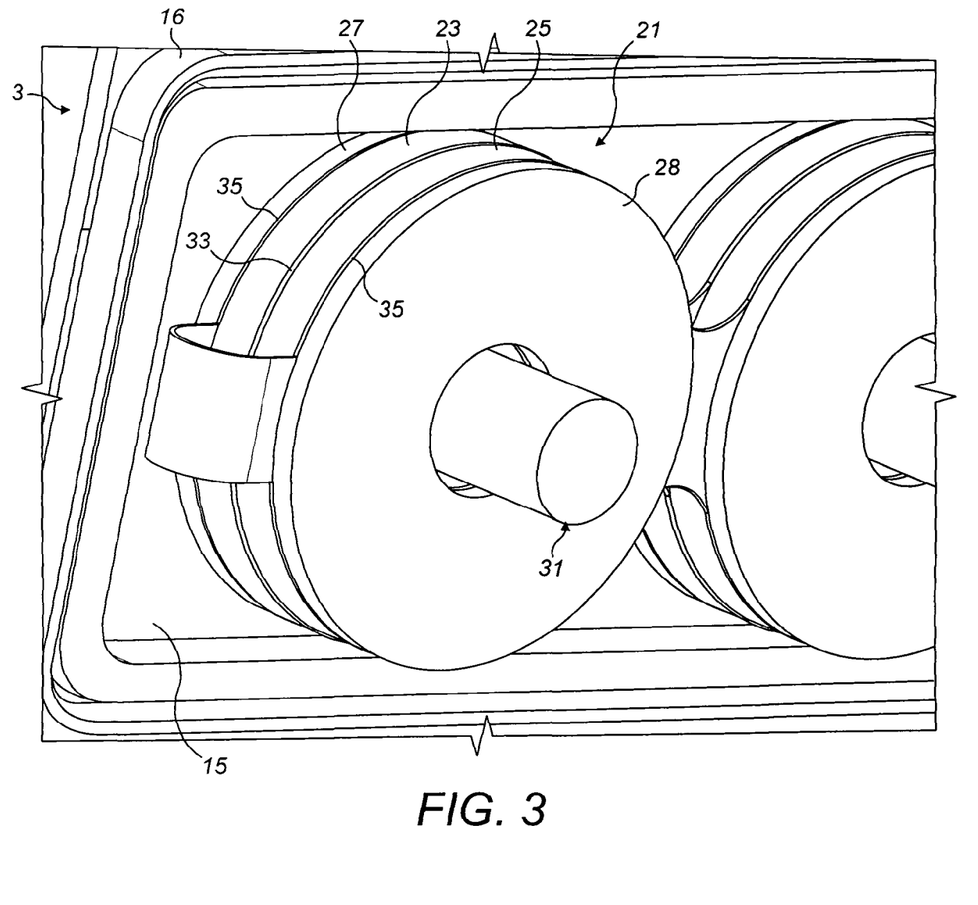
FIG. 3 illustrates an enlarged perspective view of a piezoelectric actuator at one end of the printing head of FIG. 1, illustrating the folded connection at one end of the busbar assembly.
Figure 4:
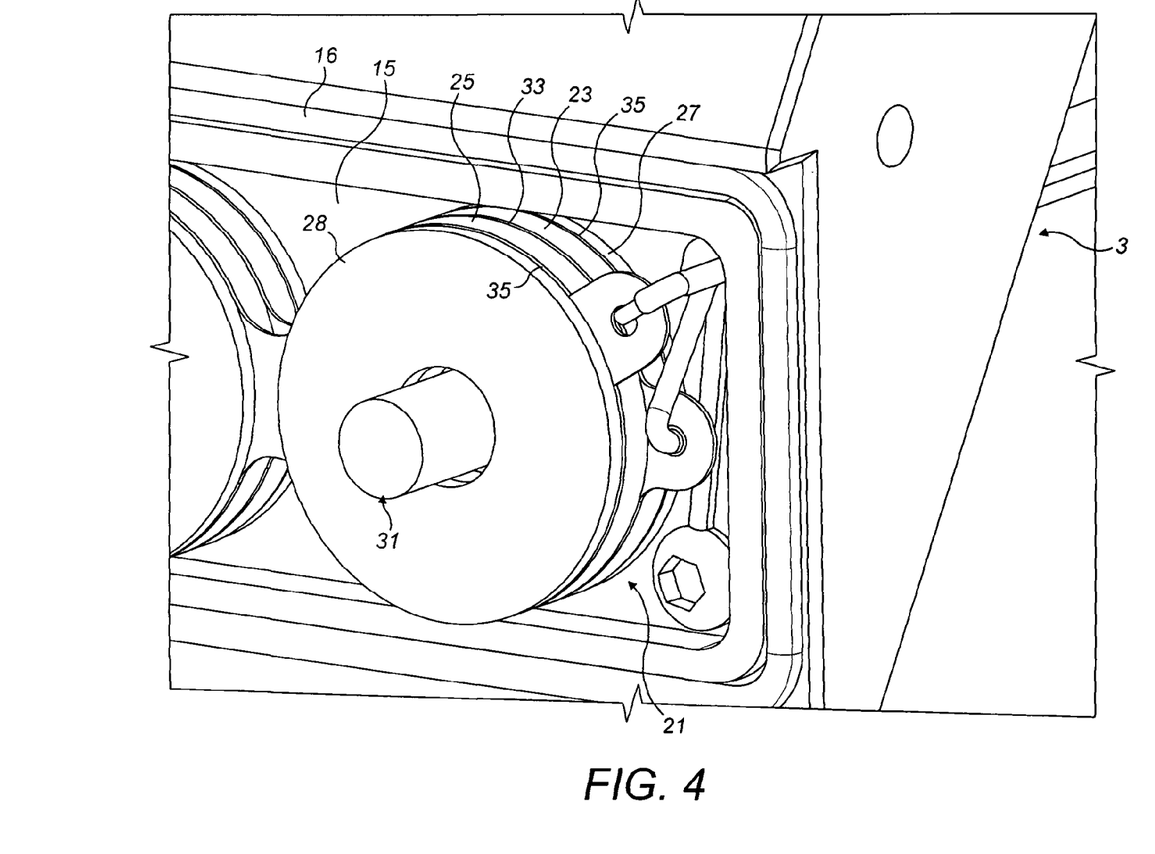
FIG. 4 illustrates an enlarged perspective view of a piezoelectric actuator at the other end of the printing head of FIG. 1, illustrating the connection terminals at the other end of the busbar assembly.

In this embodiment each piezoelectric actuator 21 comprises a plurality of, here two stacked piezoelectric members 23, 25, which are electrically connected to a busbar assembly 26, and insulator elements 27, 28 which are located to opposite sides of the busbar assembly 26, such as to isolate the piezoelectric members 23, 25 from the main body 3 and the support element 5.

In this embodiment the piezoelectric members 23, 25 are ring-shaped, here having an inner diameter of 6 mm, an outer diameter of 20 mm and a thickness of 2 mm. In other embodiments the piezoelectric members 23, 25 could be formed of different shapes, such blocks, cubes and prisms. Also, in another embodiment the piezoelectric members 23, 25 of the piezoelectric actuators 21 could be formed as an integral element, such as in the form of an elongate bar.

In this embodiment the percentage of the area of the engaging surfaces of the piezoelectric actuators 21 to the area of the engaging surface of the support element 5 is about 59%, and about 43% of the engaging surface of the printing blade 7. In a preferred embodiment the percentage of the area of the engaging surfaces of the piezoelectric actuators 21 to the area of the engaging surface of the support element 5 is at least about 40%, preferably at least about 50%. In a preferred embodiment the percentage of the area of the engaging surfaces of the piezoelectric actuators 21 to the area of the engaging surface of the printing blade is at least about 30%, preferably at least about 40%.

In this embodiment the support element 5 is attached by threaded couplings 31 to the main body 3, with the threaded couplings 31 being set to a predetermined torque, such as to apply a predetermined compressive force to the stacked piezoelectric members 23, 25.

In this embodiment the busbar assembly 16 comprises a first, inner electrode 33 to opposite sides of which the piezoelectric members 23, 25 are respectively disposed and a second, common outer electrode 35 between which the piezoelectric members 23, 25 are sandwiched. With this arrangement, in this embodiment the piezoelectric actuators 21 are electrically connected in parallel.

In this embodiment the insulator elements 27, 28 comprise discs, with each piezoelectric actuator 21 having a pair of elements 27, 28. In an alternative embodiment the insulator elements 27, 28 for all of the piezoelectric actuators 21 could be formed as integral elements.

The printing head further comprises edge deflectors 37, 39 which are attached to the opposite ends of the main body 3 and act to prevent the print medium from escaping beyond the ends of the printing head.

The printing head further comprises a wideband multi-frequency power supply 41 which is connected to the electrodes 33, 35 of the vibration unit 9 to cause the vibration of the support element 5, here sweeping a frequency range of from about 20 kHz to about 200 kHz, in one embodiment at a frequency of at least about 30 kHz, in one embodiment at a frequency of at most about 100 kHz, preferably at most about 80 kHz, more preferably at most about 60 kHz and still more preferably at most about 50 kHz, and here with a displacement of at least about 0.4 µm, in one embodiment with a displacement of at least about 1 µm, preferably at least about 2 μm, more preferably at least about 5 μm, and in one embodiment with a displacement of at most about 100 μm, preferably a displacement of at most about 25 μm.

In this embodiment the power supply 41 drives the support element 5 at a resonant frequency of 33.6 kHz when driven at 46 W (50 VA apparent power) and a displacement of 6 μm.

In this embodiment, by sweeping a frequency range, it is ensured that the resonant frequency of each of the piezoelectric actuators 21 is encompassed. This frequency sweeping has the advantage of not requiring the piezoelectric actuators 21 to be all tuned precisely to a single, common resonant frequency, and in one embodiment the piezoelectric actuators 21 can be specifically tuned to different resonant frequencies. By virtue of having the piezoelectric actuators 21 differently tuned, the piezoelectric actuators 21 will resonate at different time points in dependence upon their resonant frequency, thereby avoiding simultaneous resonance of the piezoelectric actuators 21, which could avoid the development of standing waves.

With the described vibration regime, the present invention achieves both a significantly increased transfer efficiency from finer pitch apertures, and an increased area coverage, particularly from the finer pitch apertures.

The present invention will now be described with reference to the following non-limiting Examples.

Example #1

Using the above-described printing head, a solder paste (Type 4, lead free—no clean) was printed through a 100 μm thick stainless printing screen having square apertures with dimensions ranging from 100 μm to 550 μm, both with (Dynamic) and without (Standard) the vibration regime.

Figure 5:
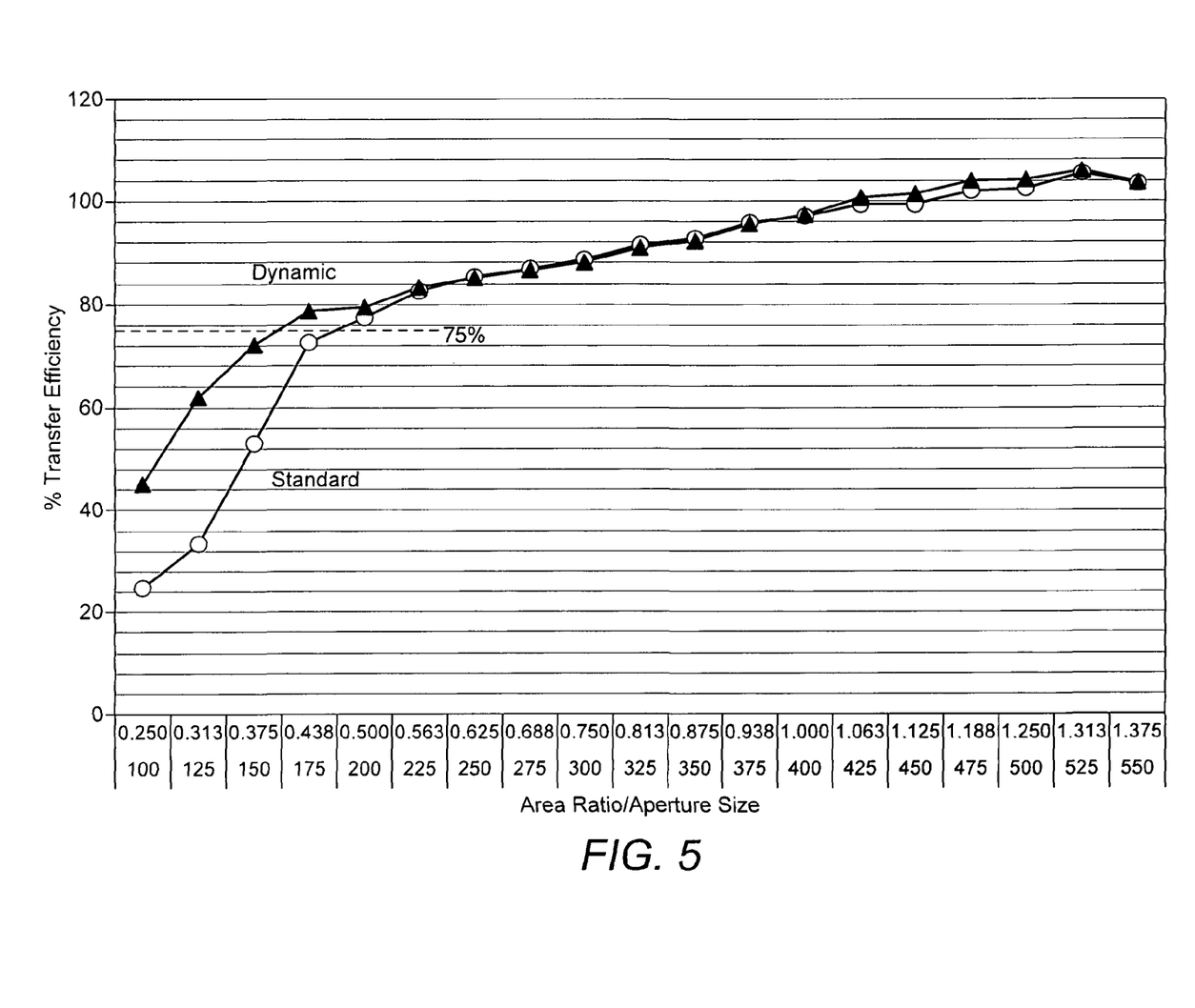
FIG. 5 illustrates plots of transfer efficiency as a function of area ratio for deposits printed in Example #1, both with (Dynamic) and without (Standard) the vibration regime.

FIG. 5 illustrates plots of transfer efficiency as a function of area ratio with (Dynamic) and without (Standard) the vibration regime. As will be observed, the transfer efficiency is significantly increased for finer pitch apertures having smaller area ratios.

In this embodiment, for a transfer efficiency of 75%, the printing head when utilizing the vibration regime (Dynamic) enables printing at area ratios down to about 0.4, whereas the printing head without the vibration regime (Standard) enables printing down to area ratios of only about 0.47.

Figure 6:
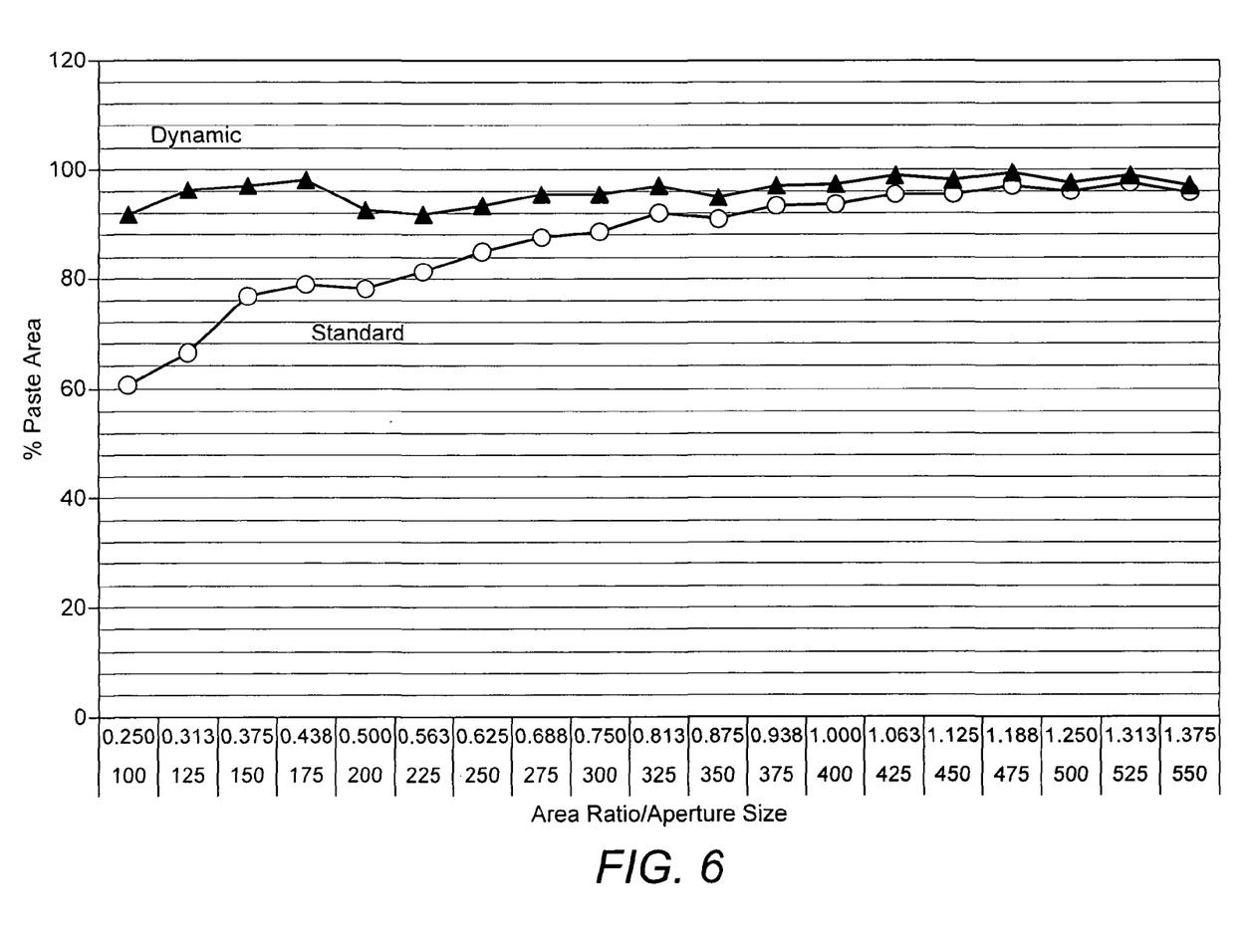
FIG. 6 illustrates plots of area coverage as a function of area ratio for deposits printed in Example #1, both with (Dynamic) and without (Standard) the vibration regime.

FIG. 6 illustrates plots of area coverage as a function of area ratio with (Dynamic) and without (Standard) the vibration regime. As will be observed, the area coverage is significantly increased, particularly for finer pitch apertures having smaller area ratios.

Example #2

Using the above-described printing head, a solder paste (Type 4, lead free—no clean) was printed through a 100 μm thick stainless printing screen having square apertures with a side dimension of 210 μm, thereby having an area ratio on 0.525, both with (Dynamic) and without (Standard) the vibration regime.

Figure 7A:
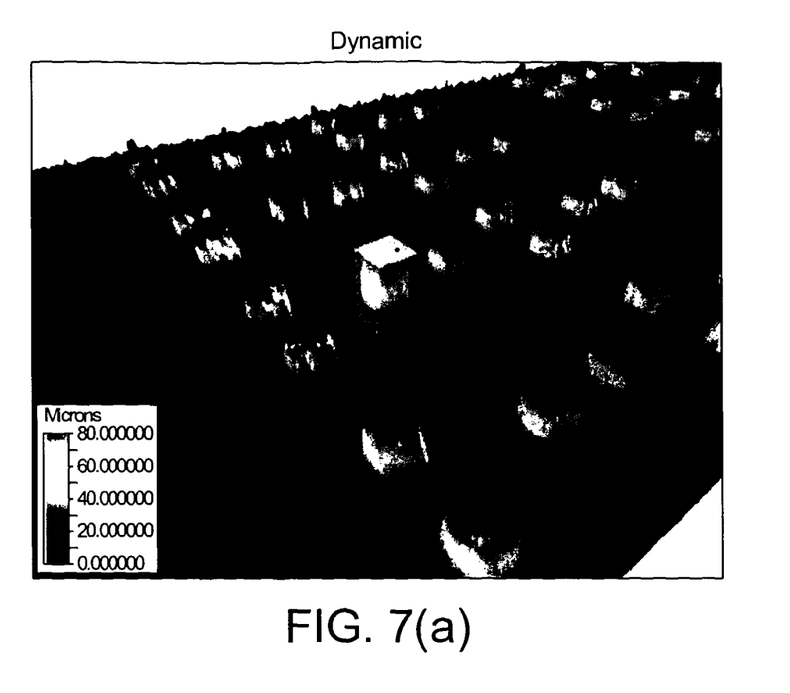
FIGS. 7(a) and (b) illustrate micrographs of deposits printed in Example #2, both with (Dynamic) and without (Standard) the vibration regime.
Figure 7B:
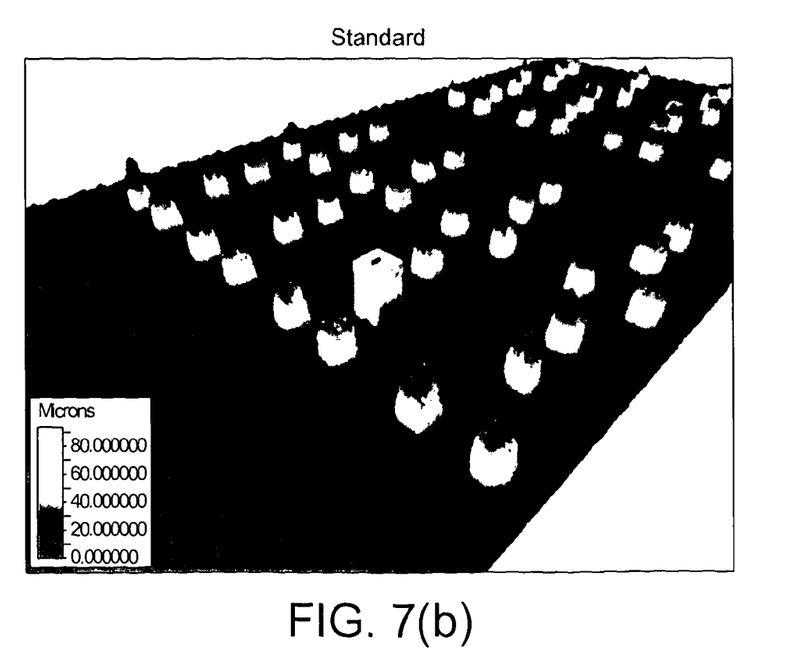

FIGS. 7(a) and (b) illustrate micrographs of the deposits achieved with (Dynamic) and without (Standard) the vibration regime. As will be observed, there is an improvement in transfer efficiency.

Example #3

Using the above-described printing head, a solder paste (Type 4, lead free—no clean) was printed through a 100 μm thick stainless printing screen having circular apertures with a diameter of 160 μm, thereby having an area ratio on 0.4, both with (Dynamic) and without (Standard) the vibration regime.

Figure 8A:
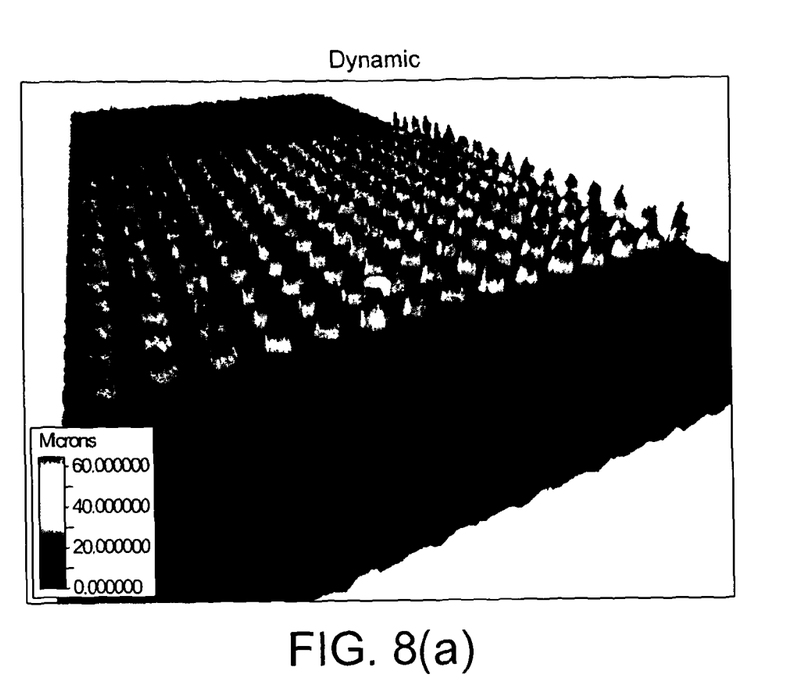
FIGS. 8(a) and (b) illustrate micrographs of deposits printed in Example #3, both with (Dynamic) and without (Standard) the vibration regime.
Figure 8B:
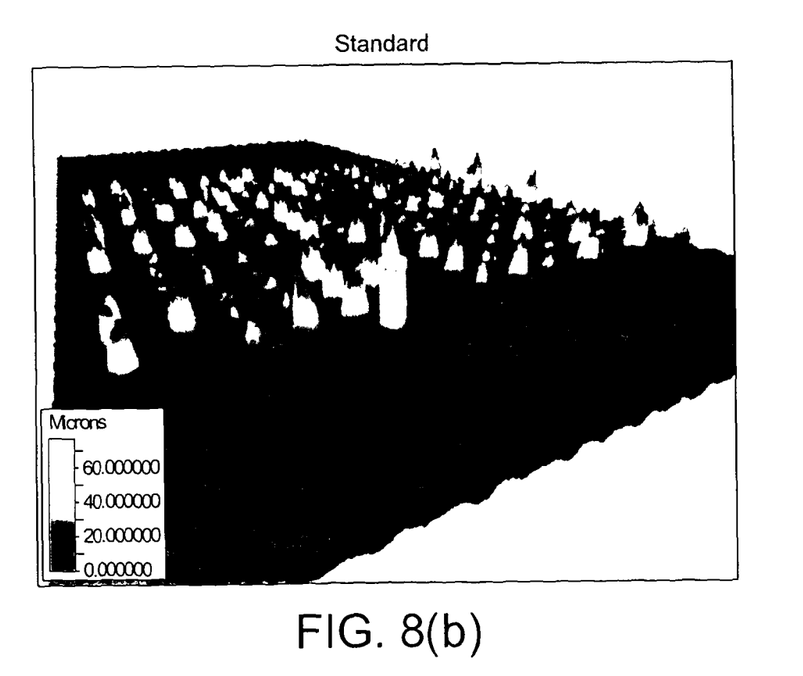

FIGS. 8(a) and (b) illustrate micrographs of the deposits achieved with (Dynamic) and without (Standard) the vibration regime. As will be observed, the improvement in transfer efficiency for these finer pitch apertures is remarkable, when compared to the benefit achieved for larger pitch apertures as in Example #2.

Figure 9:
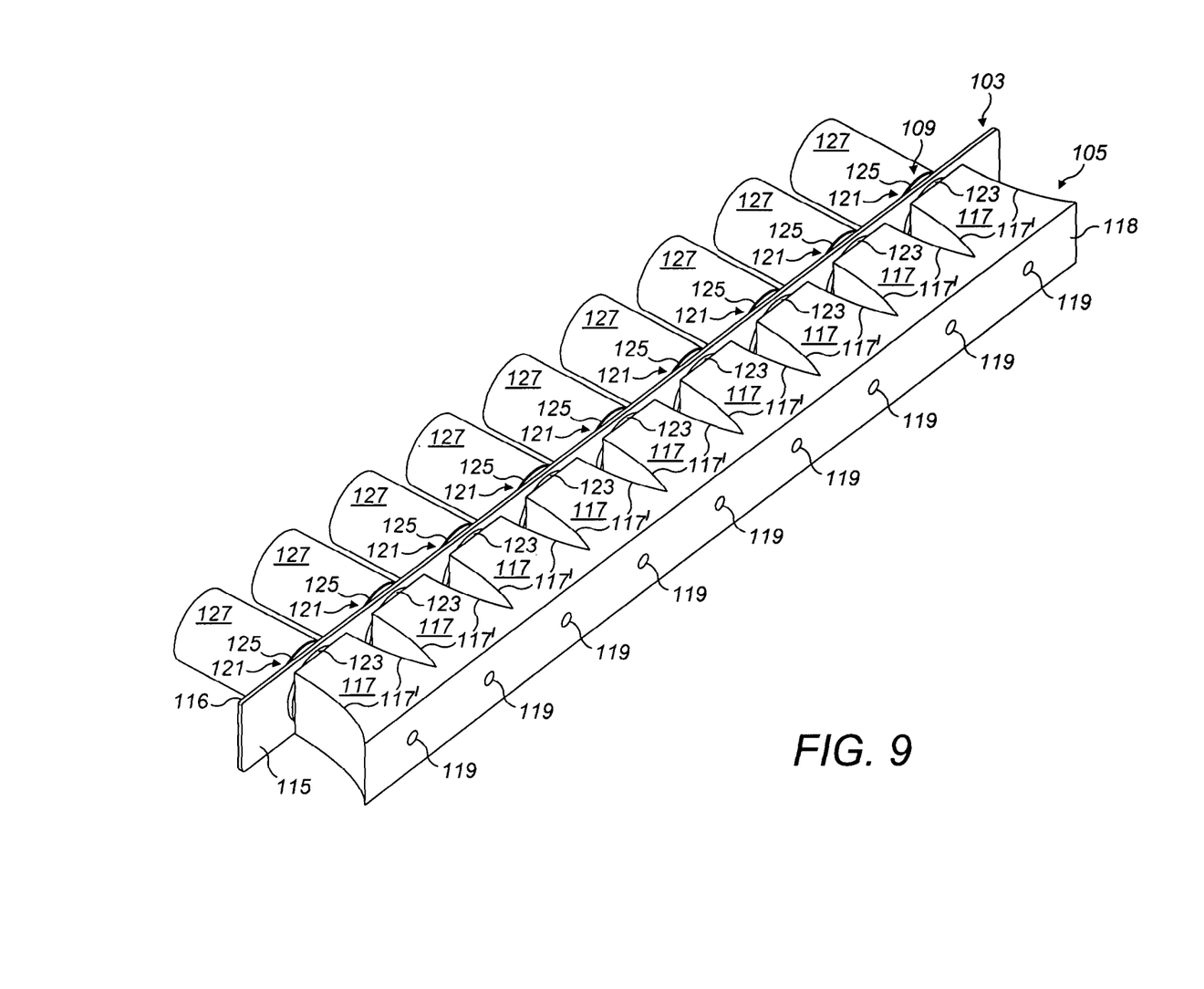
FIG. 9 illustrates a perspective view of a screen printing head in accordance with a second embodiment of the present invention.
Figure 10:
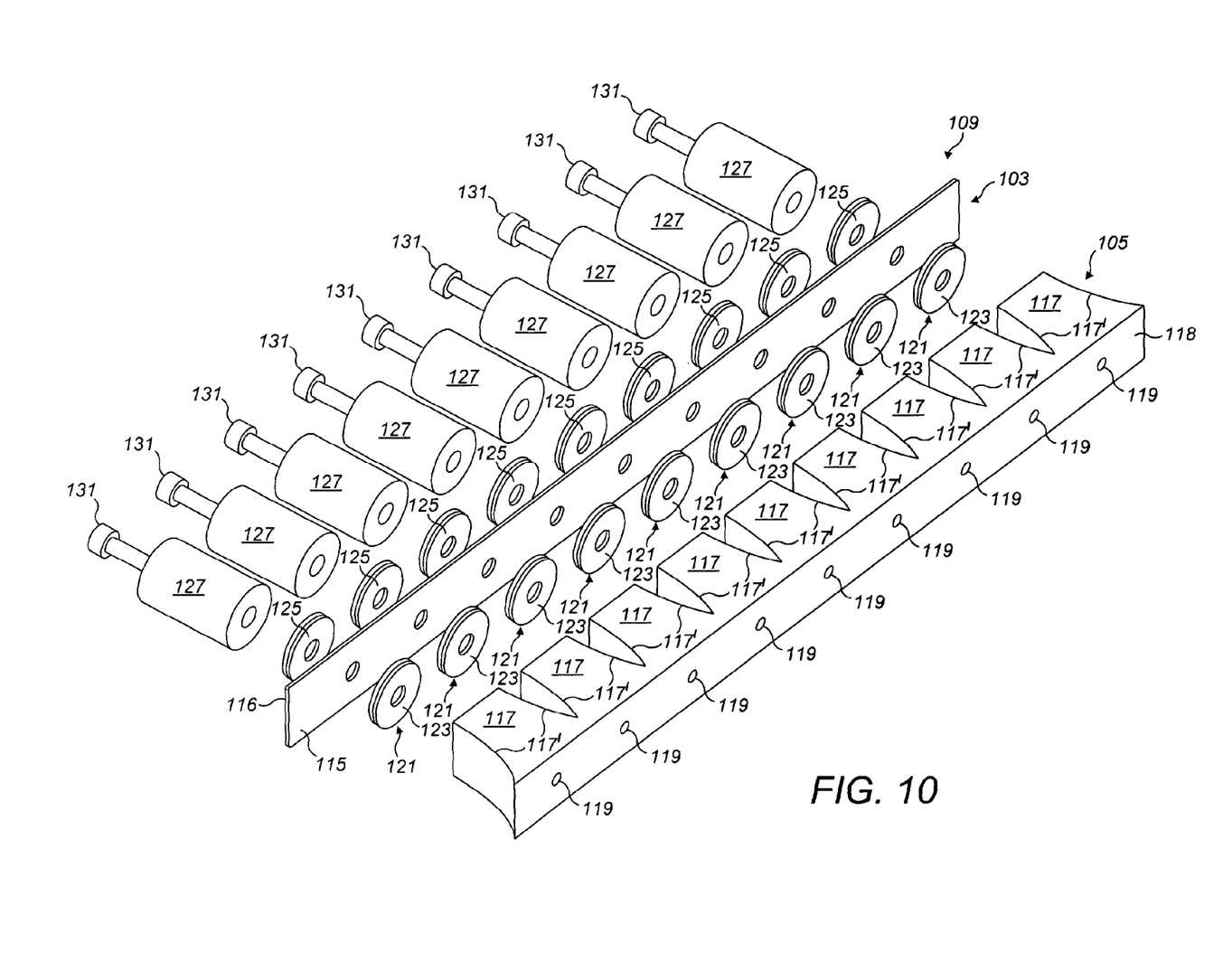
FIG. 10 illustrates an exploded perspective view of the screen printing head of FIG. 9.

FIGS. 9 and 10 illustrate a screen printing head in accordance with a second embodiment of the present invention.

The screen printing head comprises a main support body 103, in this embodiment an elongate member, which is in use coupled to the print head transport mechanism (not illustrated) of a screen printing machine which is operative to displace the printing head over a printing screen which is located over a workpiece and print deposits of a print medium through a pattern of apertures in the printing screen onto the workpiece, a support member 105, in this embodiment an elongate member, to which a printing blade (not illustrated) is attached, and a vibration unit 109 which couples the support member 105 to the main body 103 to provide for vibration of the support member 105, and hence the printing blade.

As will be discussed in more detail hereinbelow, the vibration of the printing blade imparts an energy to the print medium ahead of the printing blade, which acts to condition the print medium. This conditioning improves the filling of the apertures in the printing screen and the transfer of the print medium from the filled apertures to the workpiece when separating the workpiece from the printing screen.

In this embodiment the main body 103 includes oppositely-facing mounting surfaces 115, 116 to which the vibration unit 109 is mounted.

The support member 105 comprises a plurality of mass elements 117, each being spaced from one another at the interface with the vibration unit 109 and terminating at a single, common attachment surface 118 to which the printing blade is fitted, thereby providing a single common front mass.

In this embodiment the mass elements 117 are tuned, through selection of the material, here aluminium, and the dimensions, in order to provide a quarter-wave resonance. In other embodiments the mass elements could be dimensioned to provide resonance at other harmonics, such as 3λ/4.

In this embodiment the mass elements 117 flare outwardly, such that the dimension at the forward end is greater than that at the interface with the main body 103, thereby enabling the transmission of the vibration to an enlarged surface area.

In this embodiment the mass elements 117 comprise horns, here planar horns, which flare outwardly, preferably with a shape having a lateral surface 117' with an exponential surface function.

In this embodiment the attachment surface 118 includes at least one, in this embodiment a plurality of attachment elements 119, in this embodiment a plurality of threaded couplings, here threaded apertures, arranged along the length of the attachment surface 118, for enabling the printing blade to be removably fitted to the support member 105 without requiring dis-assembly of the vibration unit 109.

In this embodiment the attachment surface 118 is inclined to the vertical at an angle corresponding to the angle at which the printing blade is required to depend. In a preferred embodiment the attachment surface 118 is configured such that the printing blade depends at an angle between about 20 degrees and about 70 degrees, typically at about 45 degrees and about 60 degrees.

In this embodiment the printing blade is a squeegee blade, here a metal blade, either formed of stainless steel or aluminium. Other possible blade materials include rubber, plastic and composite materials. In addition, the printing blade could be a hybrid structure, such as a plastic blade with a metal screen-contacting tip element or a metal blade with a plastic screen-contacting tip element.

The printing blade is attached to the support element by at least one, in this embodiment a plurality of attachment elements (not illustrated), in this embodiment a plurality of threaded couplings, here a plurality of threaded screws, which are coupled to respective ones of the attachment elements 119 of the support member 105, and a retaining plate (not illustrated) which is clamped against the printing blade.

In this embodiment the vibration unit 109 is an ultrasonic unit for ultrasonically vibrating the support member 105, here in a frequency range of from about 20 kHz to about 200 kHz, in one embodiment at a frequency of at least about 30 kHz, in one embodiment at a frequency of at most about 100 kHz, preferably at most about 80 kHz, more preferably at most about 60 kHz and still more preferably at most about 50 kHz, and here with a displacement of at least about 0.4 µm, in one embodiment with a displacement of at least about 1 µm, preferably at least about 2 µm, more preferably at least about 5 µm, and in one embodiment with a displacement of at most about 100 µm, preferably a displacement of at most about 25 µm.

In this embodiment the vibration unit 109 comprises at least one vibrator 121, here a plurality of vibrators 121, in this embodiment corresponding in number to the mass elements 117 of the support member 105, which are spaced along the length of the main body 103.

In this embodiment the or each vibrator 121 comprises a piezoelectric actuator.

In this embodiment each piezoelectric actuator 121 comprises a plurality of, here two piezoelectric members 123, 125, and a rear mass element 127, which is counterpart to the respective front mass element 117 of the support member 105.

In this embodiment the rear mass elements 127 are tuned, through selection of the material, here aluminium, and the dimensions, in order to provide a quarter-wave resonance. In other embodiments the mass elements could be dimensioned to provide resonance at other harmonics, such as 3λ/4.

In this embodiment the piezoelectric members 123, 125 are ring-shaped, here having an inner diameter of 6 mm, an outer diameter of 20 mm and a thickness of 2 mm. In other embodiments the piezoelectric members 123, 125 could be formed of different shapes, such blocks, cubes and prisms. Also, in another embodiment the piezoelectric members 123, 125 of the piezoelectric actuators 121 could be formed as an integral element, such as in the form of an elongate bar.

In a preferred embodiment the percentage of the area of the engaging surfaces of the piezoelectric actuators 121 to the area of the engaging surface of the support member 105 is at least about 40%, preferably at least about 50%.

In a preferred embodiment the percentage of the area of the engaging surfaces of the piezoelectric actuators 121 to the area of the engaging surface of the printing blade is at least about 30%, preferably at least about 40%.

In this embodiment the support member 105 and the rear mass elements 127 are attached by threaded couplings 131 to the main body 103, with the threaded couplings 131 being set to a predetermined torque, such as to apply a predetermined compressive force to the piezoelectric members 123, 125.

In this embodiment the piezoelectric members 123, 125 are disposed to opposite sides of the main body 103, whereby the main body 103 is located at the node of the piezoelectric unit 109.

In this embodiment the main body 103 is an electrical conductor, or at least supports conductive elements, such that the main body 103 provides a common busbar for the piezoelectric members 123, 125. With this arrangement, in this embodiment the piezoelectric actuators 121 are electrically connected in parallel.

In an alternative embodiment the piezoelectric members 123, 125 could be stacked to one side of the main body 103.

In another alternative embodiment the piezoelectric members 123, 125 could be stacked and the main body 103 could comprise first and second support members which are located to opposite sides of the stacked piezoelectric members 123, 125.

The printing head further comprises a wideband multi-frequency power supply of the same kind as the above-described first embodiment, which is connected of the vibration unit 109 to cause the vibration of the support member 105, here sweeping a frequency range of from about 20 kHz to about 200 kHz, in one embodiment at a frequency of at least about 30 kHz, in one embodiment at a frequency of at most about 100 kHz, preferably at most about 80 kHz, more preferably at most about 60 kHz and still more preferably at most about 50 kHz, and here with a displacement of at least about 0.4 µm, in one embodiment with a displacement of at least about 1 µm, preferably at least about 2 µm, more preferably at least about 5 µm, and in one embodiment with a displacement of at most about 100 µm, preferably a displacement of at most about 25 µm.

With the described vibration regime, the present invention achieves both a significantly increased transfer efficiency from finer pitch apertures, and an increased area coverage, particularly from the finer pitch apertures.

Figure 11:
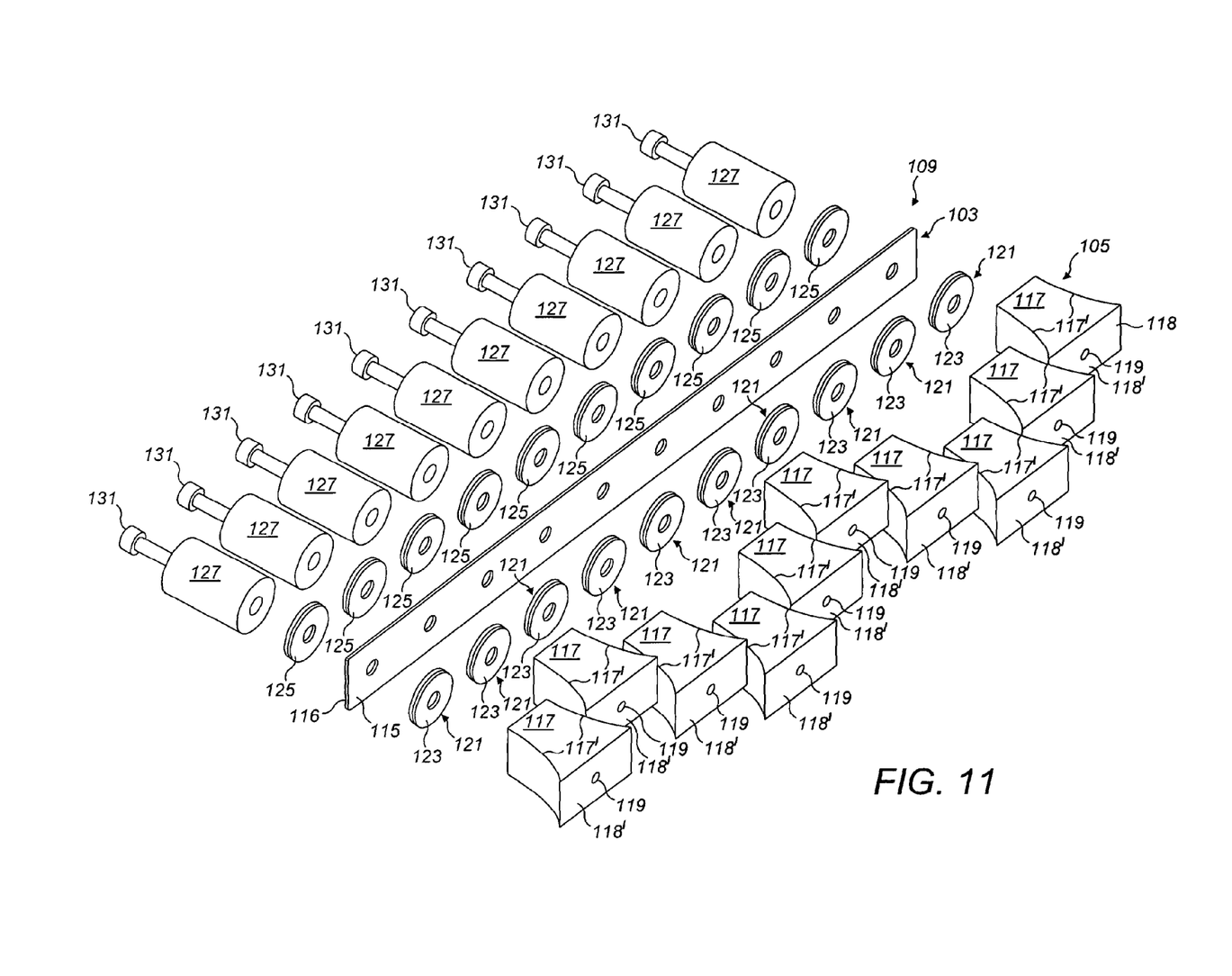
FIG. 11 illustrates an exploded perspective view of a screen printing head as a modification of the screen printing head of FIG. 9.

FIG. 11 illustrates a modification of the screen printing head of FIGS. 9 and 10.

This embodiment is very similar to that of the second-described embodiment, and thus, in order to avoid unnecessary duplication of description, only the differences will be described in detail, with like parts being designated by like reference signs.

In this embodiment the support member 105 is provided by a plurality of separate front mass elements 117 which do not commonly terminate, but are provided as separate masses, with the attachment surface 118 being provided by a plurality of attachment surfaces 118' as provided by each of the separate front mass elements 117.

With this configuration, the vibrational energy is more efficiently transferred to the front mass elements 117, and hence the printing blade attached thereto.

Figure 12:
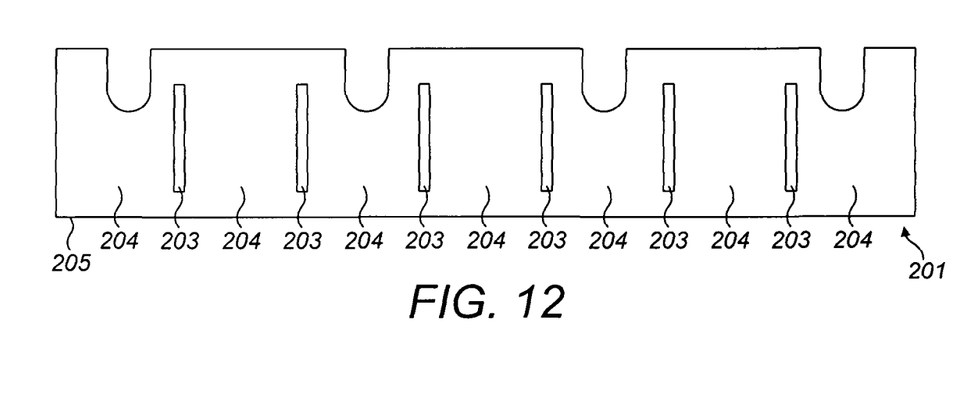
FIG. 12 illustrates a printing blade in accordance with a preferred embodiment of the present invention.

FIG. 12 illustrates a printing blade in accordance with a preferred embodiment of the present invention.

The printing blade comprises a blade element 201, in this embodiment an elongate element, which includes a plurality of disruptions 203 at spaced locations therealong, which act to isolate applied vibrational energy into respective segments 204 of the blade element 201.

In this embodiment the disruptions 203 extend in a direction from, here substantially orthogonally, a contact edge 205 of the blade element 201.

In another embodiment the disruptions 203 could flare inwardly or outwardly from the contact edge 205.

In this embodiment the disruptions 203 extend from a location spaced from the contact edge 205, such as to provide a continuous edge.

In this embodiment the disruptions 203 each comprise an elongate aperture.

In another embodiment the disruptions 203 could each comprise a plurality of chained apertures, in the form of perforations.

In a further embodiment the disruptions 203 could each comprise an elongate recess or a plurality of chained recesses.

In still another embodiment the disruptions 203 could each comprise an elongate projection or a plurality of chained projections.

In this embodiment the printing blade is a squeegee blade, here a metal blade, either formed of stainless steel or aluminium. Other possible blade materials include rubber, plastic and composite materials. In addition, the printing blade could be a hybrid structure, such as a plastic blade with a metal screen-contacting tip element or a metal blade with a plastic screen-contacting tip element.

Finally, it will be understood that the present invention has been described in its preferred embodiments and can be modified in many different ways without departing from the scope of the invention as defined by the appended claims.

In one alternative embodiment the power supply 41 could be configured to drive the piezoelectric actuators 21, 121 at a single frequency, or at selected individual frequencies. Where the piezoelectric actuators 21, 121 are driven at a single driving frequency, the frequency can be determined by identifying the resonant frequency for each piezoelectric actuator 21, 121 and selecting the driving frequency based on the identified resonant frequencies. In one embodiment the resonant frequency of each piezoelectric actuator 21, 121 can be identified by scanning the frequency and identifying a peak in the drawn current. In one embodiment the driving frequency for the piezoelectric actuators 21, 121 can be determined from a best fit to the identified resonant frequencies.

In another alternative embodiment the piezoelectric actuators 21, 121 could be tuned to have a single, common resonant frequency, and the power supply 41 configured to drive the piezoelectric actuators 21, 121 at the tuned frequency.

In an alternative embodiment the or each vibrator 21, 121 could comprise a pneumatic vibrator, such as a ball vibrator, a turbine vibrator or a roll vibrator.

In another alternative embodiment the or each vibrator 21, 121 could comprise a magnetostriction vibrator, such as a ferrite magnetostrictive vibrator.

In other alternative embodiments the rear mass elements 127 of the second-described embodiment could be provided as a single common mass, in the same manner as the support member 105 thereof.

The invention claimed is:

1. A screen printing head for printing deposits of a print medium onto a workpiece through apertures in a printing screen, comprising:
   a support body for attachment to a screen printing machine;
   a support member comprising an elongate member;
   a printing blade attached to the support member, wherein the printing blade is a squeegee blade; and
   a vibration unit which couples the support member to the support body to provide for vibration of the support member, and hence the printing blade when attached thereto;
   wherein the vibration unit vibrates the support member at one or more frequencies in the range of from about 20 kHz to about 50 kHz and with a displacement of the support member of at least about 0.4 µm, such that the printing head provides a transfer efficiency of at least 75% through apertures having an area ratio of 0.4.

2. The printing head of claim 1, wherein the support member comprises (a) a plurality of mass elements, each being spaced from one another at an interface with the vibration unit and terminating at a single, common attachment surface to which the printing blade is in use fitted, thereby providing a single, common mass or (b) a plurality of separate mass elements, thereby providing a plurality of separate masses.

3. The printing head of claim 2, wherein the mass elements comprise horns which flare outwardly to have a greater dimension at a forward end thereof.

4. The printing head of claim 1, wherein the vibration unit vibrates the support member at a frequency of at least about 30 kHz.

5. The printing head of claim 4, wherein the vibration unit vibrates the support member with a displacement of at least about 1 µm, at least about 2 µm or at least about 5 µm.

6. The printing head of claim 4, wherein the vibration unit vibrates the support member with a displacement of at most about 100 µm or at most about 25 µm.

7. The printing head of claim 1, wherein the vibration unit comprises a plurality of piezoelectric actuators.

8. The printing head of claim 7, wherein the piezoelectric actuators have an engaging surface which engages a facing surface of the support member, and the percentage of the area of the engaging surface of the piezoelectric actuators to the area of the facing surface of the support member is at least about 40% or at least about 50%.

9. The printing head of claim 7, further comprising:
   a power supply for providing a drive signal to drive the piezoelectric actuators to cause the same to vibrate.

10. The printing head of claim 9, wherein the power supply is a multi-frequency power supply which provides a drive signal which sweeps a frequency range of from about 20 kHz to about 200 kHz and has an amplitude which yields a displacement of the support member of at least about 0.4 µm.

11. The printing head of claim 9, wherein the power supply is a multi-frequency power supply which provides a drive signal which has a plurality of discrete frequencies in a frequency range of from about 20 kHz to about 200 kHz and an amplitude which yields a displacement of the support member of at least about 0.4 µm.

12. The printing head of claim 9, wherein the power supply provides a drive signal which has a single frequency in a frequency range of from about 20 kHz to about 200 kHz and an amplitude which yields a displacement of the support member of at least about 0.4 µm.

13. The printing head of claim 7, wherein the piezoelectric actuators are spaced along a length of the support body.

14. The printing head of claim 13, wherein each piezoelectric actuator comprises a plurality of piezoelectric members and a busbar assembly which electrically connects the piezoelectric members to a power supply.

15. The printing head of claim 14, wherein the piezoelectric members of the respective piezoelectric actuators are separate members or the piezoelectric members of some or all of the piezoelectric actuators are formed as a common element.

16. The printing head of claim 14, wherein the piezoelectric members are ring shaped.

17. The printing head of claim 14, wherein the piezoelectric members are stacked between a surface of the support body and the support member.

18. The printing head of claim 14, wherein each piezoelectric actuator further comprises a rear mass element and the piezoelectric members are disposed to opposite sides of the support body, one between a surface of the support body and the support member and the other between a surface of the support body and the rear mass element.

19. The printing head of claim 18, wherein the rear mass elements are (a) each spaced from one another at an interface with the support body and terminate at a single, common rear surface, thereby providing a single, common mass or (b) separate mass elements, thereby providing a plurality of separate masses.

20. The printing head of claim 13, wherein the piezoelectric actuators have an engaging surface which engages a facing surface of an attached printing blade, and the percentage of the area of the engaging surface of the piezoelectric actuators to the area of the facing surface of the printing blade is at least about 30% or at least about 40%.

21. A method of using a screen printing head for printing deposits of a print medium onto a workpiece through apertures in a printing screen, the method comprising the steps of:
providing the screen printing head comprising the steps of:
attaching a support body to a screen printing machine;
providing a support member comprising an elongate member;
providing a printing blade attached to the support member, wherein the printing blade is a squeegee blade; and
coupling the support member to the support body by a vibration unit;
and
operating the vibration unit to provide for vibration of the support member, and hence the printing blade attached thereto, to condition the print medium forward of the printing blade;
wherein the vibration unit vibrates the support member at one or more frequencies in the range of from about 20 kHz to about 50 kHz and with a displacement of the support member of at least about 0.4 µm, such that the printing head provides a transfer efficiency of at least 75% through apertures having an area ratio of 0.4.

22. The method of claim 21, wherein the support member comprises (a) a plurality of mass elements, each being spaced from one another at an interface with the vibration unit and terminating at a single, common attachment surface to which the printing blade is in use fitted, thereby providing a single, common mass or (b) a plurality of separate mass elements, thereby providing a plurality of separate masses.

23. The method of claim 22, wherein the mass elements comprise horns which flare outwardly to have a greater dimension at a forward end thereof.

24. The method of claim 21, wherein the vibration unit vibrates the support member at a frequency of at least about 30 kHz.

25. The method of claim 24, wherein the vibration unit vibrates the support member with a displacement of at least about 1 µm, at least about 2 µm or at least about 5 µm.

26. The method of claim 24, wherein the vibration unit vibrates the support member with a displacement of at most about 100 µm or at most about 25 µm.

27. The method of claim 21, wherein the vibration unit comprises a plurality of piezoelectric actuators.

28. The method of claim 27, wherein the piezoelectric actuators have an engaging surface which engages a facing surface of the support member, and the percentage of the area of the engaging surface of the piezoelectric actuators to the area of the facing surface of the support member is at least about 40% or at least about 50%.

29. The method of claim 28, wherein the piezoelectric actuators have an engaging surface which engages a facing surface of an attached printing blade, and the percentage of the area of the engaging surface of the piezoelectric actuators to the area of the facing surface of the printing blade is at least about 30% or at least about 40%.

30. The method of claim 27, further comprising:
a power supply for providing a drive signal to drive the piezoelectric actuators to cause the same to vibrate.

31. The method of claim 30, wherein the power supply is a multi-frequency power supply which provides a drive signal which sweeps a frequency range of from about 20 kHz to about 200 kHz and has an amplitude which yields a displacement of the support member of at least about 0.4 µm.

32. The method of claim 30, wherein the power supply is a multi-frequency power supply which provides a drive signal which has a plurality of discrete frequencies in a predetermined frequency range encompassing one or more resonant frequencies of the piezoelectric actuators.

33. The method of claim 30, wherein the power supply provides a drive signal which has a single frequency in a predetermined frequency range encompassing one or more resonant frequencies of the piezoelectric actuators.

34. The method of claim 27, wherein the piezoelectric actuators are spaced along a length of the support body.

35. The method of claim 34, wherein each piezoelectric actuator comprises a plurality of piezoelectric members and a busbar assembly which electrically connects the piezoelectric members to a power supply.

36. The method of claim 35, wherein the piezoelectric members of the respective piezoelectric actuators are separate members or the piezoelectric members of some or all of the piezoelectric actuators are formed as a common element.

37. The method of claim 35, wherein the piezoelectric members are ring shaped.

38. The method of claim 35, wherein the piezoelectric members are stacked between a surface of the support body and the support member.

39. The method of claim 35, wherein each piezoelectric actuator further comprises a rear mass element and the piezoelectric members are disposed to opposite sides of the support body, one between a surface of the support body and the support member and the other between a surface of the support body and the rear mass element.

40. The method of claim 35, wherein the rear mass elements are (a) each spaced from one another at an interface with the support body and terminate at a single, common rear surface, thereby providing a single, common mass or (b) separate mass elements, thereby providing a plurality of separate masses.

* * * * *